United States Patent
Hasebe et al.

(10) Patent No.: US 7,452,826 B2
(45) Date of Patent: Nov. 18, 2008

(54) OXIDATION METHOD AND OXIDATION SYSTEM

(75) Inventors: Kazuhide Hasebe, Tokyo-To (JP); Kota Umezawa, Tokyo-To (JP); Yutaka Takahashi, Tokyo-To (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/502,503

(22) Filed: Aug. 11, 2006

(65) Prior Publication Data

US 2006/0276051 A1 Dec. 7, 2006

Related U.S. Application Data

(62) Division of application No. 10/992,469, filed on Nov. 19, 2004, now Pat. No. 7,129,186.

(30) Foreign Application Priority Data

| Nov. 20, 2003 | (JP) | ............................ 2003-390982 |
| Oct. 21, 2004 | (JP) | ............................ 2004-307295 |

(51) Int. Cl.
 H01L 21/31 (2006.01)
 H01L 21/469 (2006.01)
(52) U.S. Cl. .................... 438/766; 438/694; 438/758; 257/E21.282; 257/E21.283
(58) Field of Classification Search ................. 438/694, 438/735, 758, 766, 770, 774; 257/E21.282, 257/E21.283, E21.285
See application file for complete search history.

(56) References Cited

U.S. PATENT DOCUMENTS

| 6,037,273 | A | 3/2000 | Gronet et al. |
| 6,599,845 | B2 | 7/2003 | Sato et al. |
| 6,869,892 | B1 | 3/2005 | Suzuki et al. |
| 7,304,002 | B2 * | 12/2007 | Nishita et al. ............... 438/758 |

FOREIGN PATENT DOCUMENTS

| JP | 57-1232 | 1/1982 |
| JP | 3-140453 | 6/1991 |
| JP | 4-18727 | 1/1992 |
| JP | 176052 | 6/2002 |

* cited by examiner

*Primary Examiner*—Phuc T Dang
(74) *Attorney, Agent, or Firm*—Smith, Gambrell & Russell, LLP

(57) ABSTRACT

An oxidation method is capable of forming oxide films in an improved interfilm thickness uniformity. The oxidation method includes the steps of supplying an oxidizing gas and a reducing gas into a processing vessel 22 capable of being evacuated and holding a plurality of workpieces W arranged at predetermined pitches, and creating a process atmosphere containing active oxygen species and active hydroxyl species in the processing vessel 22 through the interaction of the oxidizing gas and the reducing gas. At least either of the oxidizing gas and the reducing gas is jetted into an upstream region S1, a middle region S2 and a downstream region S3, with respect to the flowing direction of the gas, of a processing space S containing the workpieces W.

4 Claims, 4 Drawing Sheets

US 7,452,826 B2

OXIDATION METHOD AND OXIDATION SYSTEM

CROSS REFERENCE TO RELATED APPLICATION

This application is a division of Ser. No. 10/992,469, filed Nov. 19, 2004, now U.S. Pat. No. 7,129,186 which is being incorporated in its entirety herein by reference.

BACKGROUND OF THE INVENTION

1. Field of the Invention

The present invention relates to an oxidation method of oxidizing the surface of a workpiece, such as a semiconductor wafer, and an oxidation system for carrying out the oxidation method.

2. Description of the Related Art

Generally, a semiconductor integrated circuit if fabricated by subjecting a semiconductor wafer, such as a silicon wafer, to processes including a film deposition process, an etching process, an oxidation process, a diffusion process and a modifying process. The oxidation process, for example, oxidizes the surface of a single-crystal or polycrystalline silicon film or a metal film. The oxidation process is used particularly for forming a gate oxide film and an insulating film for a capacitor.

Oxidation processes are classified into atmospheric oxidation processes to be carried out in an atmosphere of a pressure approximately equal to the atmospheric pressure in a processing vessel and low=-pressure oxidation processes to be carried out in a vacuum atmosphere in a processing vessel evacuated at a vacuum in terms of process pressure or into wet oxidation processes using, for example, steam generated by burning hydrogen by an external combustion apparatus, such as a wet oxidation process disclosed in Patent document 1, and dry oxidation processes not using steam and supplying only ozone or oxygen into a processing vessel, such as a dry oxidation process disclosed in Patent document 2.

Generally, insulating films formed by the wet oxidation process are superior to those formed by the dry oxidation process in terms of characteristics including compressive strength, corrosion resistance and reliability. Generally, the atmospheric wet oxidation process is able to form the insulating film at an oxidation rate higher than that at which the low-pressure wet oxidation process. However, the insulating film formed by the atmospheric wet oxidation process is inferior to that formed by the low-pressure wet oxidation process in thickness uniformity.

Conventional design rules for semiconductor integrated circuits are not very severe and hence the foregoing various oxidation processes have been used properly taking into consideration purposes of oxide films, process conditions and equipment cost. Recently, semiconductor integrated circuits need very narrow lines and very thin films, and severe design rules must be applied to designing semiconductor integrated circuits. Consequently, films having higher quality, higher characteristics and higher thickness uniformity have been required in recent years. The conventional oxidation processes are unable to cope with such high requirements.

An oxidation system disclosed, for example, in Patent document 3 carries out a wet oxidation process by supplying hydrogen gas ($H_2$) and oxygen gas ($O_2$) separately into a space at the lower end of a vertical quartz reaction tube, generating steam through the interaction of $H_2$ and $O_2$ in a combustion space formed in a quartz cap, and supplying the steam upward toward wafers to oxidize the wafers. Since $H_2$ is burned in the combustion space, the atmosphere in a downstream part of the space in the processing vessel has a high steam concentration and the atmosphere in an upper part of the space in the processing vessel has a low steam concentration because the steam is consumed as the same flows upward in the processing vessel. Consequently, in some cases, the thickness of an oxide film formed on the wafer is dependent on the position of the wafer in the processing vessel and oxide films of different thicknesses are formed on the wafers, respectively.

A batch-type oxidation system disclosed in Patent document 4 arranges a plurality of semiconductor wafers in a horizontal reaction tube and supplies $O_2$ from one end of the reaction tube into the reaction tube or supplies $O_2$ and $H_2$ simultaneously into the reaction tube to form oxide films on the semiconductor wafers in a low-pressure atmosphere. This oxidation system forms a film in an atmosphere of a comparatively high pressure by a hydrogen-burning oxidation process. Since steam is a principal element of reaction in this oxidation system, it is possible that the difference in steam concentration between an upstream part and a downstream part of the space in the processing vessel with respect to the flowing direction of the gas is excessively large and oxide films having different thicknesses are formed on the semiconductor wafers.

A single-wafer processing oxidation system disclosed in Patent document 5 supplies oxygen gas and hydrogen gas into a processing vessel, generates steam in the vicinity of a semiconductor wafer, such as a silicon wafer, held in the processing vessel through the interaction of the oxygen gas and the hydrogen gas to form an oxide film by oxidizing the surface of the semiconductor wafer. When this single-wafer processing oxidation system is used, oxygen gas and hydrogen gas are supplied into the processing vessel through gas inlets at a short distance between 20 and 30 mm from the semiconductor wafer to generate steam in the vicinity of the surface of the semiconductor wafer through the interaction of the oxygen gas and the hydrogen gas, and a comparatively high process pressure is used. Consequently, the oxide film thus formed on the semiconductor wafer is unsatisfactory in thickness uniformity.

The applicant of the present invention patent application disclosed an oxidation method in Patent document 6. This oxidation method supplies an oxidizing gas, such as oxygen gas, and a reducing gas, such as hydrogen gas, simultaneously into an upstream part and a downstream part, respectively, of a processing chamber, makes the oxidizing gas and the reducing gas interact in a vacuum atmosphere to create an atmosphere containing, as principal elements, active oxygen species and active hydroxyl species, and oxidizes a silicon wafer or the like in this atmosphere.

The oxidation method disclosed in Patent document 6 will be briefly explained with reference to FIG. 4 showing a conventional oxidation system 2. The oxidation system 2 has a cylindrical, vertical processing vessel 6 and a resistance heater 4 surrounding the processing vessel 6. A wafer boat 8 is loaded into and unloaded from the processing vessel 6 through the lower open end of the processing vessel 6 by a wafer boat lifter. The wafer boat 8 holds semiconductor wafers W, such as silicon wafers, in a vertical arrangement. A $H_2$ supply nozzle 10 for supplying $H_2$ and an $O_2$ supply nozzle 12 for supplying $O_2$ are connected to lower parts of the side wall of the processing vessel 6. A discharge port 14 formed in the upper wall of the processing vessel 6 is connected to a vacuum pump or the like.

Hydrogen gas and oxygen gas supplied through the supply nozzles 10 and 12 into a lower part of a process chamber in the processing vessel 6 interact in the processing chamber at a pressure below 133 Pa in the processing vessel 6 to generate active oxygen species and active hydroxyl species. Those active species come into contact with the surfaces of the wafers W as the same rise in the processing vessel 6 to oxidize the surfaces of the wafers W.

Patent document 1: JP-A 3-140453
Patent document 2: JP-A 57-1232
Patent document 3: JP-A 4-18727
Patent document 4: JP-A 57-1232
Patent document 5: U.S. Pat. No. 6,037,273
Patent document 6: JP-B 2002-176052

Oxidation methods disclosed in Patent documents 1 to 6 are capable of forming oxide films of a satisfactory quality in high intrafilm thickness uniformity. However, those oxide films are unsatisfactory in interfilm thickness uniformity. It is inferred that such unsatisfactory interfilm thickness uniformity is due to a high active species concentration in an upstream part of the processing chamber with respect to the flowing direction of the gases and a low active species concentration in a downstream part of the processing chamber. Early solution of problems that may arise due to such unsatisfactory interfilm thickness uniformity is desired in these days when the severity of design rules for semiconductor devices and the reduction of line width film thickness are progressively increasing.

It may be possible to form films in satisfactory interfilm thickness uniformity by heating the wafers held on the wafer boat at different temperatures gradually changing in the direction of arrangement of the wafers by the so-called temperature tilt control. Since the respective temperatures of the wafers held on the wafer boat differ slightly from each other, the different wafers have different heat histories, respectively, and the different heat histories may affect adversely to the characteristics of the films. Accordingly, temperature tilt control is unacceptable.

SUMMARY OF THE INVENTION

The present invention has been made in view of those problems to solve those problems effectively. Accordingly, it is an object of the present invention to provide an oxidation method capable of forming oxide films in improved interfilm thickness uniformity and an oxidation system for carrying out the oxidation method.

An oxidation method in a first aspect of the present invention includes the steps of: supplying an oxidizing gas and a reducing gas into a processing vessel defining a processing space, and capable of holding a plurality of workpieces at predetermined pitches and of being evacuated; creating a process atmosphere containing active oxygen species and active hydroxyl species through the interaction of the oxidizing gas and the reducing gas; and oxidizing surfaces of the workpieces in the process atmosphere; wherein at least either of the oxidizing gas and the reducing gas is jetted into an upstream region, a middle region and a downstream region of the processing space where the workpieces are held.

For example, in the oxidation method, the oxidizing gas is jetted only into the upstream region, with respect to the flowing direction of the gas, of the processing space.

The oxidizing gas contains at least one of $O_2$, $N_2O$, $NO$, $NO_2$ and $O_3$, and the reducing gas contains at least one of $H_2$, $NH_3$, $CH_4$, HCl and heavy hydrogen.

A recording medium in a second aspect of the present invention stores control software for controlling an oxidation system to carry out an oxidation method of oxidizing surfaces of a plurality of workpieces arranged at predetermined pitches in a processing vessel capable of being evacuated including the steps of: jetting an oxidizing gas and a reducing gas into the processing vessel, creating a process atmosphere containing active oxygen species and active hydroxyl species through the interaction of the oxidizing gas and the reducing gas, and oxidizing surfaces of the workpieces in the process atmosphere; wherein the step of jetting the oxidizing gas and the reducing gas into the processing vessel jets at least either of the oxidizing gas and the reducing gas into an upstream region, a middle region and a downstream region, with respect to the flowing direction of the gases, of a processing space defined by the processing vessel.

For example, the step of jetting the gases jets the oxidizing gas only into the upstream region, with respect to the flowing direction of the gases, of the processing space.

For example, the oxidizing gas contains at least one of $O_2$, $N_2O$, NO, $NO_2$ and $O_3$, and the reducing gas contains at least one of $H_2$, $NH_3$, $CH_4$, HCl and heavy hydrogen.

An oxidation system in a third aspect of the present invention includes: a workpiece holding means for holding a plurality of workpieces at predetermined pitches; a processing vessel of a predetermined length capable of containing the workpiece holding means to subject the workpieces to an oxidation process and of being evacuated; a heating means for heating the workpieces; an evacuating system for evacuating the processing vessel; an oxidizing gas supply means for supplying an oxidizing gas into the processing vessel; and a reducing gas supply means for supplying a reducing gas into the processing vessel; wherein at least either of the oxidizing gas supply means and the reducing gas supply means includes gas outlets opening at least into an upstream region, a middle region and a downstream region, with respect to the flowing direction of the gas, of a processing space in the processing vessel in which the workpieces are arranged.

For example, in the oxidation system, the oxidizing gas supply means has an oxidizing gas jetting nozzle having only a single gas outlet opening into the upstream region, with respect to the flowing direction of the gas, of the processing space.

For example, in the oxidation system, the reducing gas supply means has at least one reducing gas jetting nozzle extended along the processing space and provided with at least gas outlets opening into the upstream region, the middle region and the downstream region, with respect to the flowing direction of the gas, of the processing space.

For example, in the oxidation system, the reducing gas supply means has a first reducing gas jetting nozzle having a gas outlet opening into the upstream region, with respect to the flowing direction of the gas, of the processing space and a second reducing gas jetting nozzle having gas outlets respectively opening into the middle and the downstream region.

For example, in the oxidation system, the reducing gas supply means has a reducing gas jetting nozzle provided with a plurality of gas outlets arranged at predetermined pitches over all the length of the processing space.

For example, in the oxidation system, the reducing gas supply means has a reducing gas jetting nozzle having an up section extending from the upstream to the downstream region of the processing space, a bend formed by bending the reducing gas nozzle in the downstream region, and a down section extending down from the bend to the upstream region and provided with a plurality of gas outlets longitudinally arrangement at predetermined pitches.

For example, in the oxidation system, the reducing gas supply means has a first reducing gas jetting nozzle extended substantially over all the processing space and provided with a plurality of gas outlets formed at predetermined pitches, and a second reducing gas jetting nozzle having an up section extending from the upstream to the downstream region of the processing space, a bend formed by bending the reducing gas nozzle in the downstream region, and a down section extending down from the bend to the upstream region and provided with a plurality of gas outlets longitudinally arrangement at predetermined pitches.

For example, in the oxidation system, the reducing gas supply means has a reducing gas jetting nozzle provided with gas outlets only in a section thereof extending in the upstream region of the processing space.

For example, in the oxidation system, the oxidizing gas supply means has at least one oxidizing gas jetting nozzle extending in the processing space and provided with gas outlets opening into the upstream, the middle and the down stream region, with respect to the flowing direction of the gas, of the processing space.

The oxidizing gas contains at least one of $O_2$, $N_2O$, NO, $NO_2$ and $O_3$, and the reducing gas contains at least one of $H_2$, $NH_3$, $CH_4$, HCl and heavy hydrogen.

According to the present invention, at least either of the oxidizing gas and the reducing gas is jetted into the upstream, the middle and the downstream region of the processing space to improve the interfilm thickness uniformity of the oxide films.

DESCRIPTION OF THE PREFERRED EMBODIMENTS

Figure 1:
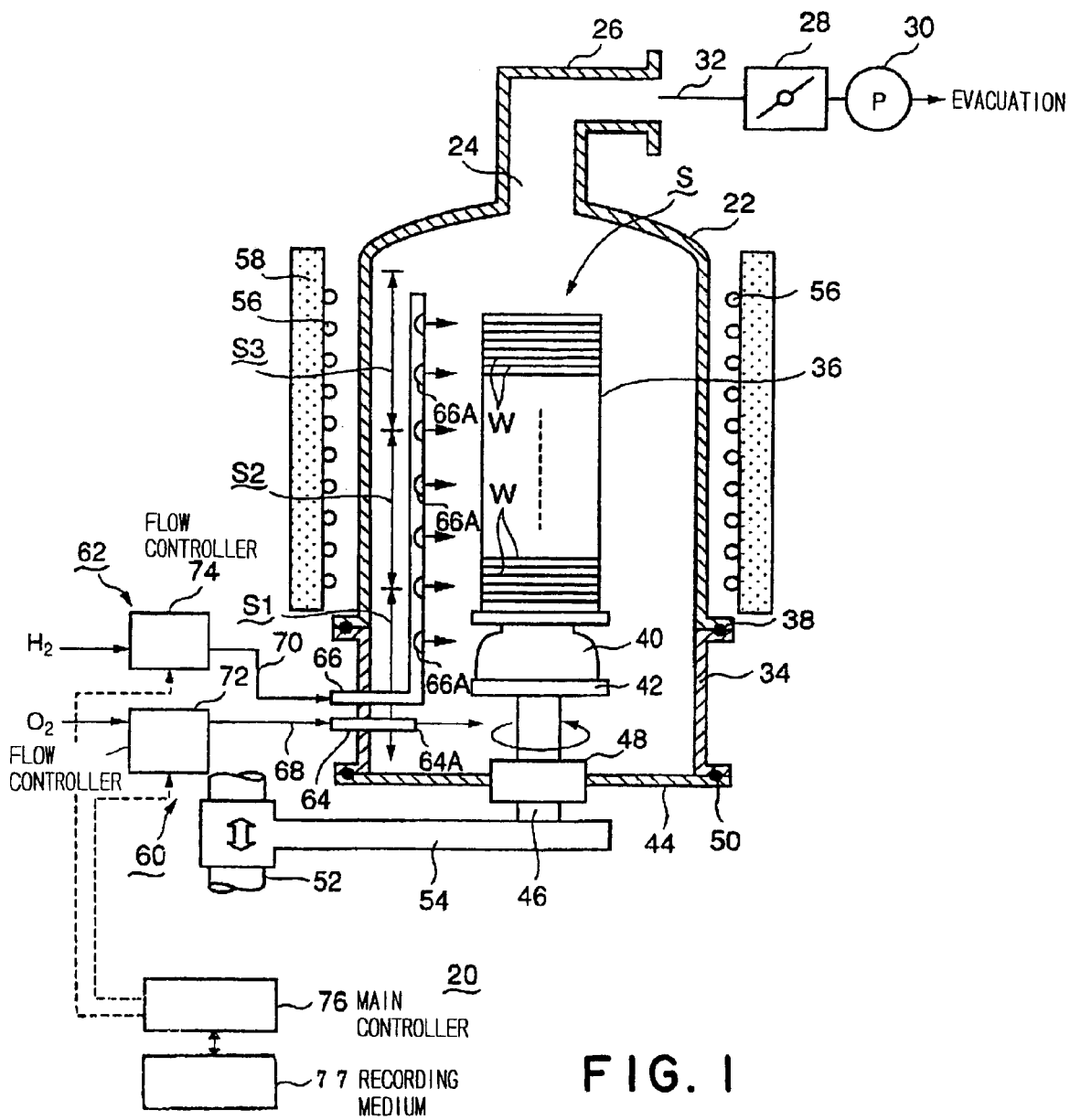
FIG. 1 is a schematic view of an oxidation system in a first embodiment according to the present invention.

An oxidation method and oxidation systems embodying the present invention will be described with reference to the accompanying drawings.

An oxidation system 20 in a first embodiment according to the present invention for carrying out an oxidation method according to the present invention will be described with reference to FIG. 1. The oxidation system 20 includes a vertical, cylindrical processing vessel 22 having an open lower end. The processing vessel 22 may be formed of, for example, quartz having high heat resistance.

A discharge port 24 is formed in the top wall of the processing vessel 22. A horizontal discharge line 26 has a vertical part connected to the discharge port 24. An evacuating system 32 including a pressure control valve 28 and a vacuum pump 30 is connected to the discharge line 26 to evacuate the processing vessel 22.

A cylindrical manifold 34 formed of, for example, a stainless steel is disposed under the processing vessel 22 to support the processing vessel 22 thereon. A quartz wafer boat 36 holds a plurality of semiconductor wafers W (hereinafter, referred to simply as "wafers W"), namely, workpieces, in a vertical arrangement at predetermined pitches. The wafer boat 36 can be vertically moved to load the wafers W into and unload the same from the processing vessel 22 through the open lower end of the processing vessel 22. A sealing member, such as an O ring, is held between the lower end of the processing vessel 22 and the upper end of the manifold 34 to seal the joint of the processing vessel 22 and the manifold 34. The wafer boat 36 is able to hold, for example, about fifty 300 mm diameter wafers W in a vertical arrangement at substantially equal pitches.

The wafer boat 36 is supported on a quartz heat-insulating tube 40 mounted on a table 42. The table 42 is joined to the upper end of a rotating shaft 46 penetrating a lid 44 for covering the lower open end of the manifold 34. A gap between the rotating shaft 46 and the lid 44 is sealed by a magnetic fluid seal 48 to create a nonleaking union between the rotating shaft 46 and the lid 44 when the rotating shaft 46 rotates. A sealing member 50, such as an O ring, is held between a peripheral part of the lid 44 and the lower end of the manifold 34 to seal the processing vessel 22 in an airtight fashion.

The rotating shaft 46 is supported on a free end of an arm 54 supported on a lifting mechanism 52, such as a boat elevator. The wafer boat 36 and the lid 44 can be simultaneously moved in vertical directions. The table 42 may be fixed to the lid 44 to process the wafers W without rotating the wafer boat 36.

The processing vessel 22 is surrounded by a heating unit 56 similar to that mentioned in JP-A 2003-209063. The heating unit 56 is provided with a heating element formed from a carbon wire. The heating unit 56 heats the processing vessel 22 and the wafers W held in the processing vessel 22. The heating element formed from a carbon wire is capable of keeping a process environment clean and has an excellent temperature elevating and lowering characteristic. The heating unit 56 is covered with a heat-insulator 58 to ensure thermal stability. Gas supply members for supplying gases into the processing vessel 22 are arranged on the manifold 34.

More concretely, an oxidizing gas supply system 60 for supplying an oxidizing gas into the processing vessel 22 and a reducing gas supply system 62 for supplying a reducing gas into the processing vessel 22 are connected to the manifold 34. The oxidizing gas supply system 60 and the reducing gas supply system 62 have an oxidizing gas jetting nozzle 64 and a reducing gas jetting nozzle 66 respectively. The gas jetting nozzles 64 and 66 penetrate the side wall of the manifold. Gas supply lines 68 and 70 are connected to the gas jetting nozzles 64 and 66 respectively. Flow controllers 72 and 74, such as mass flow controllers, are placed in the gas supply lines 68 and 70, respectively. The flow of gases through the gas supply lines 68 and 70 is controlled by the flow controllers 72 and 74 by a main controller 76, such as a microcomputer. The main controller 76 controls all the operations of the oxidation system 20. The main controller 76 is provided with a recording medium 77, such as a floppy disk. Control software (control program) for controlling the oxidation system 20 to carry out an oxidation method according to the present invention is stored in the recording medium 77.

At least either of the oxidizing gas supply system 60 and the reducing gas supply system 62 has gas outlets opening into an upstream region, a middle region and a downstream region of a processing space S in the processing vessel 22.

The wafers W are held in the processing space S in the processing vessel 22. Gases supplied into the processing vessel 22 flow upward in the processing space S and are discharged through the discharge port 24 formed in the top wall of the processing vessel 22. The height of the processing space S is slightly greater than that of the wafer boat 36. The processing space S is divided into an upstream region S1, namely, a lower region as viewed in FIG. 1, a middle region S2, namely, a middle region as viewed in FIG. 1, and a downstream region S3, namely, an upper region as viewed in FIG. 1, for convenience.

In the oxidation system 20 in the first embodiment, the oxidizing gas supply system 60 has the single oxidizing gas jetting nozzle 64 having a gas outlet 64A opening into the upstream region S1. More specifically, the gas outlet 64A is disposed at a level at a distance below the level of the lower end of the wafer boat 36 loaded into the processing vessel 22. The oxidizing gas jetting nozzle 64 may be either straight to jet the oxidizing gas in a horizontal direction or bent in an L-shape to jet the oxidizing gas upward.

The reducing gas supply system 62 has the single reducing gas jetting nozzle 66. The reducing gas jetting nozzle 66 is extended vertically over the processing space S. The reducing gas jetting nozzle 66 is provided with gas outlets 66A longitudinally arranged at predetermined pitches. Thus the reducing gas jetting nozzle 66 is able to jet the reducing gas horizontally into all the regions of the processing space S, namely, the upstream region S1, the middle region S2 and the downstream region S3. A nozzle provided with a plurality of gas outlets like the reducing gas jetting nozzle 66 will be called also "dispersion nozzle". The reducing gas jetting nozzle 66 may be provided with a gas outlet at its upper end to jet the reducing gas upward. The oxidation system 20 may be provided with a plurality of reducing gas jetting nozzles to supply the reducing gas over the entire processing space S, which will be described in connection with an oxidizing system in another embodiment according to the present invention.

The nozzles, 64 and 66 have an inside diameter between about 1 and about 4 mm. The pitches of the gas outlets 66a are in the range of abut 10 and about 20 mm. For example the pitches of the gas outlets 66A may be substantially equal to the pitches of the wafers W on the wafer boat 36. The number of the gas outlets 66A is between 15 and 25. In this embodiment, the oxidizing gas is $O_2$ and the reducing gas is $H_2$. When necessary, the oxidation system 20 is provided with an inert gas supply system, not shown, for supplying an inert gas, such as $N_2$.

An oxidation method to be carried out by the oxidation system 20 will be described.

When the oxidation system 20 is in a waiting condition where wafers W, such as silicon wafers, are not loaded into the processing vessel 22, the processing vessel 22 is maintained at a temperature lower than a process temperature. The wafer boat 36 holding a plurality of wafers W, such as fifty wafers W, is lifted up from below the processing vessel 22 in the state of a hot wall and is loaded into the processing vessel 22. Then, the lid 44 is joined to the open lower end of the manifold 34 to seal the processing vessel 22.

Then, the processing vessel 22 is evacuated and the internal pressure of the processing vessel 22 is maintained at a predetermined process pressure, and power supplied to the heating unit 56 is increased to heat the wafers W at a process temperature for oxidation. After the temperature of the wafers W has stabilized at the process temperature, predetermined process gases, namely, $O_2$ and $H_2$ in this embodiment, are supplied at controlled flow rates through the oxidizing gas jetting nozzle 64 and the reducing gas jetting nozzle 66 of the gas supply systems 60 and 62, respectively, into the processing vessel 22.

The oxidizing gas and the reducing gas interact in an evacuated atmosphere as the same flow upward in the processing vessel 22 to generate active oxygen species and active hydroxyl species. The active species come into contact with the surfaces of the wafers W held on the wafer boat 36 to oxidize the surfaces of the wafers W. The process gases or gases produced by reaction are discharged through the discharge port 24 formed in the top wall of the processing vessel 22 from the oxidation system 20.

Hydrogen gas is supplied at a flow rate between 200 and 5,000 sccm, for example, at 600 sccm. Oxygen gas is supplied at a flow rate between 200 and 10,000 sccm, for example, 1,200 sccm.

As $O_2$ and $H_2$ separately supplied into the processing vessel 22 flow upward in the processing vessel 22 in the state of a hot wall. The hydrogen gas burns in the vicinity of the wafers W to create an active atmosphere mainly of active oxygen species O* and active hydroxyl species OH*. The active species oxidize the surface of the wafers W to form $SiO_2$ films. Process conditions include a wafer temperature between 400 and 1,000° C., for example, 900° C., a process pressure between 13.3 and 1,330 Pa, for example, 133 Pa (1 torr) and a processing time of, for example, 10 min.

It is inferred that $H_2$ burns in the vicinity of the wafers W by reactions represented by chemical formulas shown below when $O_2$ and $H_2$ are supplied separately into the evacuated processing vessel 22 in the state of a hot wall. In the chemical formulas shown below, chemical notations with an asterisk are active species.

$$H_2+O_2 \rightarrow H^*+HO_2$$

$$O_2+H^* \rightarrow OH^*+O^*$$

$$H_2+O^* \rightarrow H^*+OH^*$$

$$H_2+OH^* \rightarrow H^*+H_2O$$

When $O_2$ and $H_2$ are supplied separately into the processing vessel 22, active oxygen species O*, active hydroxyl species OH* and steam $H_2O$ are generated during the burning reaction of $H_2$ and the surfaces of the wafers W are oxidized by those active species to form $SiO_2$ films. It is inferred that the active oxygen species O* and the active hydroxyl species OH* contribute effectively to oxidation. Since the reducing gas jetting nozzle 66 is a dispersion nozzle provided with the longitudinally arranged gas outlets 66A, the hydrogen gas is distributed over the entire processing space S, namely, over the upstream region S1, the middle region S2 and the downstream region S3. The oxygen gas flowing upward from the bottom of the processing space S reacts with the hydrogen gas gradually to generate the active oxygen species and the active hydroxyl species. Therefore, all the wafers W at different levels in the processing space S are surrounded by an atmosphere properly containing the active species and having a uniform species concentration. Consequently, the oxide films are formed in an improved interfilm thickness uniformity.

Figure 4:
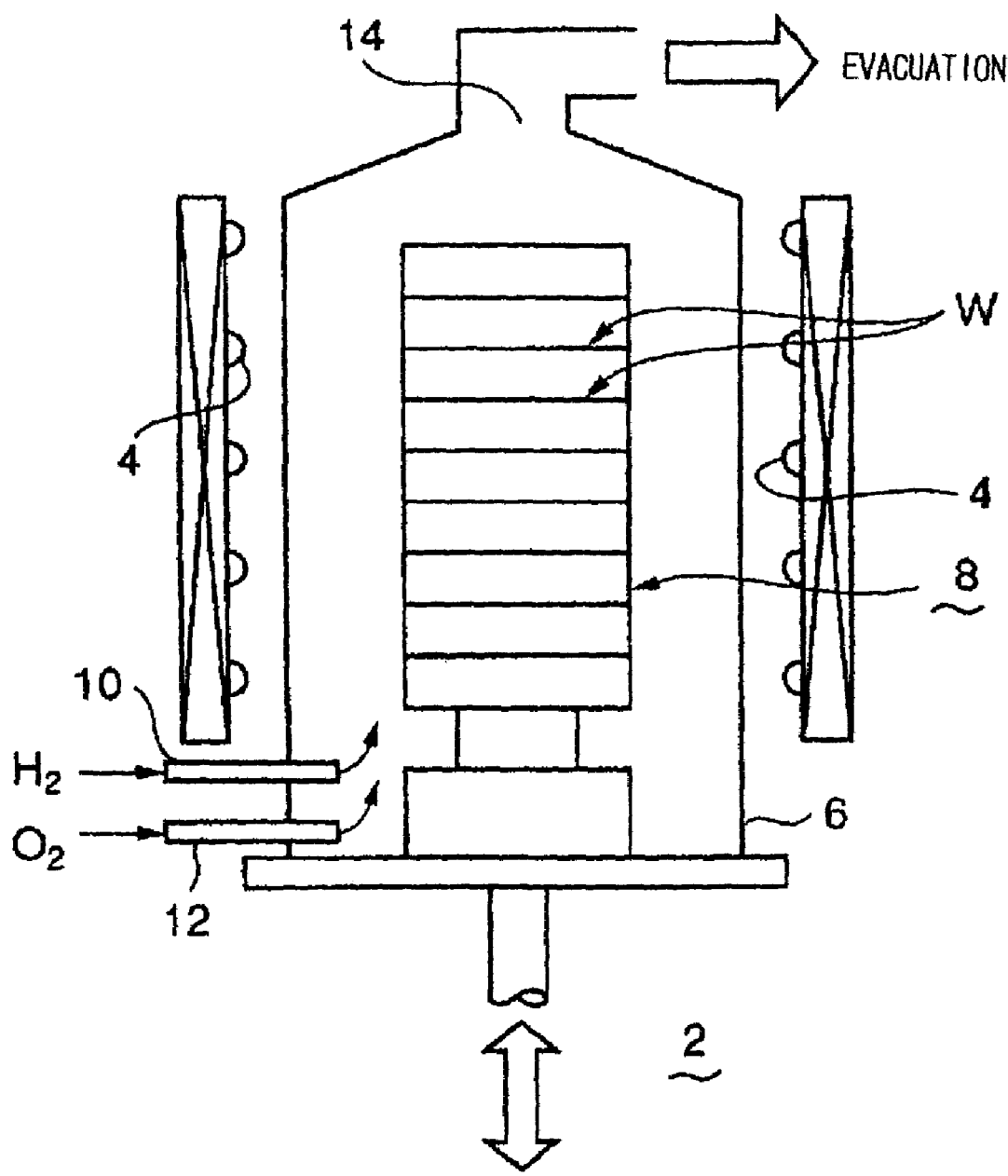
FIG. 4 is a schematic view of a conventional oxidation system.

An experimental oxidation process was performed. The interfilm thickness uniformity was ±2.89% which was far higher than an interfilm thickness uniformity of ±5.41% achieved by the conventional oxidation system shown in FIG. 4. Oxide films formed on the wafers W at different positions had satisfactorily high intrafilm thickness uniformities in the range of ±0.65% to ±0.78%, respectively.

The oxidation system 20 in the first embodiment may employ a diffusion nozzle as the oxidizing gas jetting nozzle 64 for supplying $O_2$. However, since oxygen concentration, as compared with hydrogen concentration, is distributed comparatively uniformly in the processing space S, the oxidizing gas jetting nozzle 64 does not need to be a diffusion nozzle.

Figure 2:
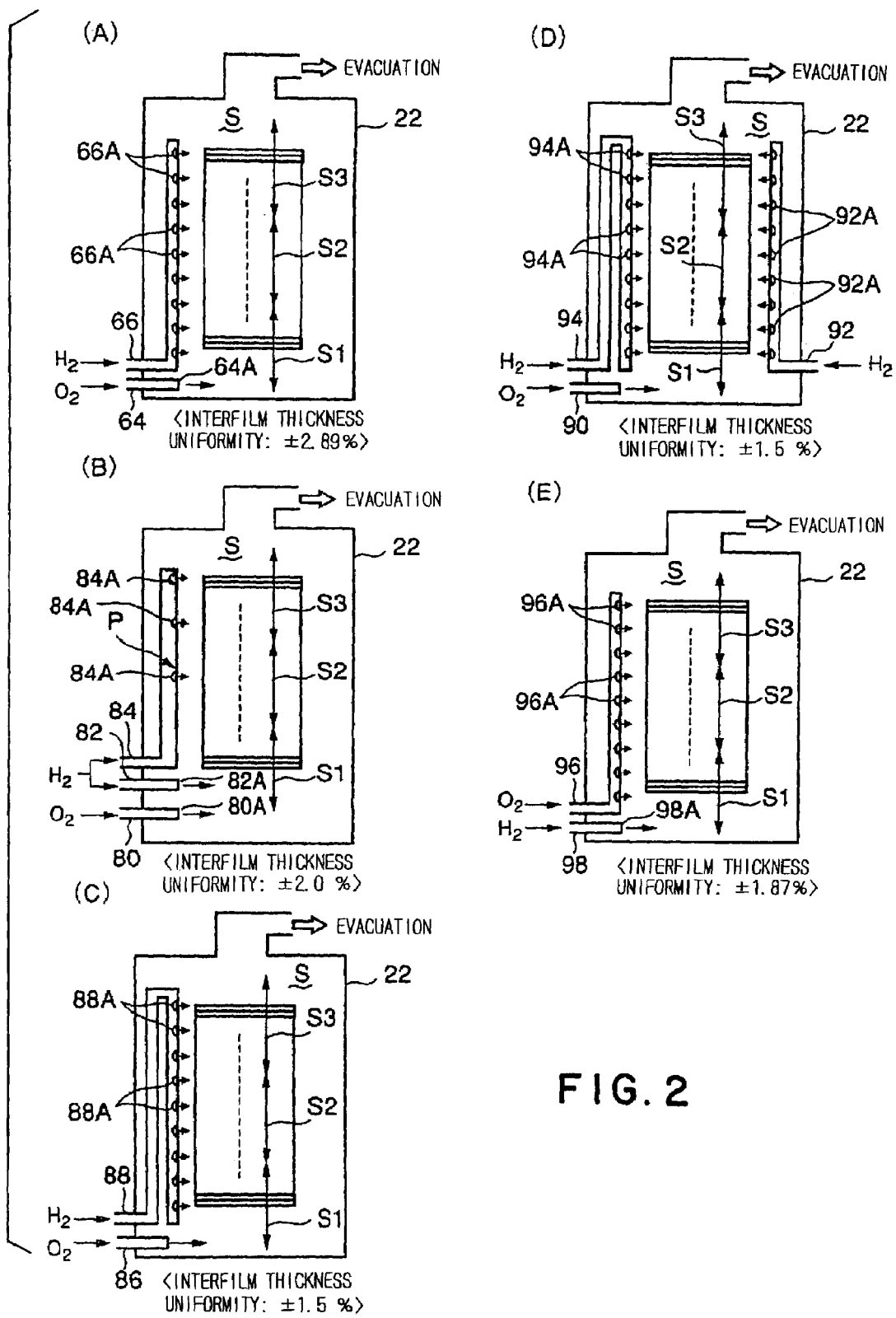
FIGS. 2(A) to 2(E) are typical views of different gas jetting nozzle arrangements.

Effects of oxidizing gas jetting nozzles 64 of different types and reducing gas jetting nozzles 66 of different types were examined. Results of examination will be explained in connection with FIG. 2.

FIGS. 2(A) to 2(E) are typical views of different gas jetting nozzle arrangements. Oxidation systems respectively provided with the gas jetting nozzle arrangements shown in FIGS. 2(A) to 2(E) were operated under the process conditions, namely, the process temperature, the process pressure and the flow rates of gases, mentioned in connection with the description of the oxidation system 20 shown in FIG. 1.

FIG. 2(A) is a typical view of the oxidation system 20 shown in FIG. 1. Films formed by the oxidation system shown in FIG. 2(A) had an interfilm thickness uniformity of ±2.89%.

FIG. 2(B) is a typical view of an oxidation system in a second embodiment according to the present invention. The oxidation system in the second embodiment is provided with an oxidizing gas jetting nozzle 80 similar to the oxidizing gas jetting nozzle 64 of the oxidation system in the first embodiment shown in FIG. 2(A) and two reducing gas jetting nozzles, namely, a first reducing gas jetting nozzle 82 and a second reducing gas jetting nozzle 84. The first reducing gas jetting nozzle 82 is similar in construction to the oxidizing gas jetting nozzle 80. The first reducing gas jetting nozzle 82 has a gas outlet 82A opening into the upstream region S1. The second reducing gas jetting nozzle 84 is similar in length and construction to the reducing gas jetting nozzle 66 of the oxidizing system 20 in the first embodiment shown in FIG. 2(A). The second reducing gas jetting nozzle 84 is provided with three gas outlets 84A respectively opening into the middle region S2, a lower part of the downstream region S3 and an upper part of the downstream region S3 to jet the reducing gas in a horizontal direction. The top gas outlet 84A may open upward to jet the reducing gas upward.

The gas outlets 82A and 84A of the reducing gas jetting nozzles 82 and 84 correspond respectively to the upstream region S1, the middle region S2 and the downstream region S3. The gas outlet 84A corresponding to the downstream region S3 may be formed in the upper end of the second reducing gas jetting nozzle 84 to jet $H_2$ upward. A position P1 in FIG. 3 corresponds to a level P1 in FIG. 2(B).

In the second embodiment, the gas outlets 84A of the second reducing gas jetting nozzle 84 are localized as compared with the gas outlets 66A of the reducing gas jetting nozzle 66 of the first embodiment shown in FIG. 2(A). Since the mass of $H_2$ is very small, $H_2$ diffuses at a very high diffusion rate. Therefore, $H_2$ gas jetted through the localized gas outlets 84A of the second reducing gas jetting nozzle 84 and through the gas outlet 82A of the first reducing gas jetting nozzle 82 diffuses all over the processing space S. Films formed by the oxidation system in the second embodiment had a very high interfilm thickness uniformity of ±0.9%. The films had high intrafilm thickness uniformities within ±1%.

Figure 3:
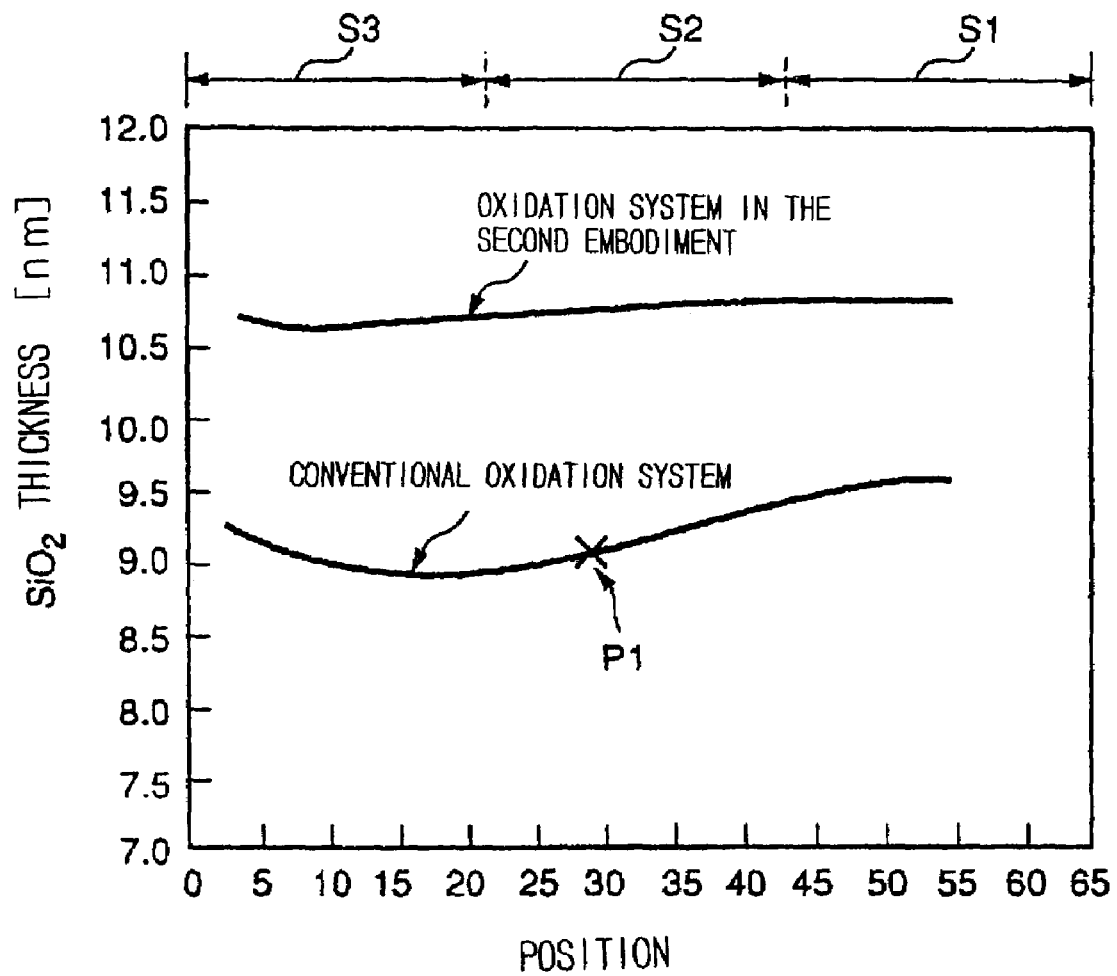
FIG. 3 is a graph comparatively showing respective thicknesses of $SiO_2$ films (oxide films) formed on wafers disposed respectively at different positions by an oxidation system in a second embodiment according to the present invention and the respective thicknesses of $SiO_2$ films formed on wafers disposed respectively at different positions by a conventional oxidation system.

Results of oxidizing processes carried out by the oxidizing system in the second embodiment and the conventional oxidizing system will be comparatively explained with reference to FIG. 3. FIG. 3 is a graph comparatively showing the thicknesses of $SiO_2$ films (oxide films) formed on fifty wafers by the oxidation system in the second embodiment and those of $SiO_2$ film formed on fifty wafers by the conventional oxidation system. As obvious from FIG. 3, whereas the $SiO_2$ films formed by the conventional oxidation system on the wafers at different levels have widely different thicknesses, the $SiO_2$ films formed by the oxidation system in the second embodiment on the wafers at different levels, respectively, are distributed within a narrow range in a high interfilm thickness uniformity.

FIG. 2(C) is a typical view of an oxidation system in a third embodiment according to the present invention. The oxidation system in the third embodiment is provided with an oxidizing gas jetting nozzle 86 similar to the oxidizing gas jetting nozzle 64 of the oxidation system in the first embodiment shown in FIG. 2(A) and a reducing gas jetting nozzle 88. The reducing gas jetting nozzle 88 has an up section extending from the upstream region S1 to the downstream region S3 of the processing space S, a bend formed by bending the reducing gas nozzle in the downstream region S3, and a down section extending down from the bend to the upstream region S1. The down section of the reducing gas jetting nozzle 88 is provided with a plurality of gas outlets 88A longitudinally arrangement at predetermined pitches similarly to the gas outlets 66A of the reducing gas jetting nozzle 66 shown in FIG. 2(A). Hydrogen gas is jetted horizontally through the gas outlets 88A all over the processing space S. Hydrogen gas flowing through the long reducing gas jetting nozzle 88 is preheated, which promotes the reaction of hydrogen gas with oxygen gas. Films formed by the oxidation system in the third embodiment had a high interfilm thickness uniformity of ±1.5%. The films had satisfactory intrafilm thickness uniformities within 1.05.

FIG. 2(D) is a typical view of an oxidation system in a fourth embodiment according to the present invention. The oxidation system in the fourth embodiment is provided with an oxidizing gas jetting nozzle 90 similar to the oxidizing gas jetting nozzle 64 of the oxidation system in the first embodiment shown in FIG. 2(A) and two reducing gas jetting nozzles, namely, a first reducing gas jetting nozzle 92 and a second reducing gas jetting nozzle 94. The first reducing gas jetting nozzle 92 extends, similarly to the reducing gas jetting nozzle 66 of the oxidation system in the first embodiment shown in FIG. 2(A), along the wafer boat 8. The first reducing gas jetting nozzle 92 is provided with a plurality of gas outlets 92a longitudinally arranged at predetermined pitches to jet the reducing gas horizontally all over the processing space S.

The second reducing gas jetting nozzle 94 is similar to the reducing gas jetting nozzle 88 shown in FIG. 2(C). The second reducing gas jetting nozzle 94 has an up section extending from the upstream region S1 to the downstream region S3 of the processing space S, a bend formed by bending the reducing gas nozzle in the downstream region S3, and a down section extending down from the bend to the upstream region S1. The down section of the reducing gas jetting nozzle 94 is provided with a plurality of gas outlets 94A longitudinally arrangement at predetermined pitches similarly to the gas outlets 88A of the reducing gas jetting nozzle 88 shown in FIG. 2(C).

Generally, when a gas is jetted through a plurality of gas outlets formed in a longitudinal arrangement in a long gas jetting nozzle, the gas is jetted at higher jetting rates through the gas outlets at upper positions with respect to the flowing direction of the gas in the gas jetting nozzle. Since the oxidation system in the fourth embodiment is provided with the two long reducing gas jetting nozzles 92 and 94, and the gas flows through the first reducing gas jetting nozzle 92 upward and flows through the second section of the second reducing gas jetting nozzle 94 downward, $H_2$ can be jetted uniformly all over the processing space S. Films formed by the oxidation system in the fourth embodiment had a high interfilm thickness uniformity of ±1.5% and satisfactory intrafilm thickness uniformities within ±1%.

FIG. 2(E) is a typical view of an oxidation system in a fifth embodiment according to the present invention. The oxidation system in the fifth embodiment is provided with an oxidizing gas jetting nozzle 96 and a reducing gas jetting nozzle 98 respectively corresponding to the reducing gas jetting nozzle 66 and the oxidizing gas jetting nozzle 64. The oxidizing gas jetting nozzle 96 is provided, similarly to the reducing gas jetting nozzle 66 of the oxidation system in the first embodiment shown in FIG. 2(A), with gas outlets 96A arranged at equal pitches. The reducing gas jetting nozzle 98 has, similarly to the oxidizing gas jetting nozzle 64 of the oxidation system in the first embodiment, a gas outlet 98A in its free end.

Films formed by the oxidation system in the fifth embodiment had a high interfilm thickness uniformity of ±1.87%. However, the films formed by the oxidation system in the fifth embodiment had considerably low intrafilm thickness uniformities within ±2.58% as compared with those of the films formed by the oxidation systems in the first to the fourth embodiment.

Although the oxidation systems embodying the present invention have been described on an assumption that all the gas outlets of the gas jetting nozzles have the same diameter, those gas outlets may have different diameters. For example, when a plurality of gas outlets are formed in a longitudinal arrangement in a gas jetting nozzle, the lower gas outlets with respect to the flowing direction of the gas may be formed in greater diameters in order that the gas is jetted through the gas outlets at substantially the same jetting rate.

The oxidizing gas is not limited to $O_2$ and may be $N_2O$, NO or $NO_2$. The reducing gas is not limited to $H_2$ and may be $NH_3$, $CH_4$ or HCl.

The present invention is applicable not only to processing semiconductor wafers but also to processing LCD substrates and glass substrates.

What is claimed is:

1. An oxidation method comprising the steps of:
    supplying an oxidizing gas and a reducing gas into a processing vessel defining a processing space, and capable of holding a plurality of workpieces at predetermined pitches and of being evacuated;
    creating a process atmosphere containing active oxygen species and active hydroxyl species through the interaction of the oxidizing gas and the reducing gas; and
    oxidizing surfaces of the workpieces in the process atmosphere,
    wherein at least either of the oxidizing gas and the reducing gas is supplied by a gas supply nozzle having gas outlets arranged longitudinally and said at least either of the oxidizing gas and the reducing gas is jetted into an upstream region from the gas outlets disposed at a bottom area of the processing space, jetted into a middle region from the gas outlets disposed at a middle area of the processing space and jetted into a downstream region from the gas outlets disposed at a top area of the processing space where the workpieces are held.

2. The oxidation method according to claim 1, wherein the oxidizing gas is jetted only in the upstream region, with respect to the flowing direction of the gases, of the processing space.

3. The oxidation method according to claim 1, wherein the oxidizing gas contains at least one of $O_2$, $N_2O$, NO, $NO_2$ and $O_3$, and the reducing gas contains at least one of $H_2$, $NH_3$, $CH_4$, HCl and heavy hydrogen.

4. The oxidation method according to claim 2, wherein the oxidizing gas contains at least one of $O_2$, $N_2O$, NO, $NO_2$ and $O_3$, and the reducing gas contains at least one of $H_2$, $NH_3$, $CH_4$, HCl and heavy hydrogen.

* * * * *